United States Patent [19]

Merchant

[11] Patent Number: 5,531,916
[45] Date of Patent: * Jul. 2, 1996

[54] HYDROFLUOROCARBON CLEANING COMPOSITIONS

[75] Inventor: Abid N. Merchant, Wilmington, Del.

[73] Assignee: E. I. Du Pont de Nemours and Company, Wilmington, Del.

[*] Notice: The portion of the term of this patent subsequent to Nov. 12, 2008, has been disclaimed.

[21] Appl. No.: 135,242

[22] Filed: Oct. 13, 1993

Related U.S. Application Data

[63] Continuation of Ser. No. 787,998, Nov. 7, 1991, abandoned, which is a continuation-in-part of Ser. No. 595,833, Oct. 11, 1990, Pat. No. 5,064,559, Ser. No. 595,834, Oct. 11, 1990, Pat. No. 5,064,560, and Ser. No. 723,312, Jun. 28, 1991, Pat. No. 5,100,572, which is a continuation-in-part of Ser. No. 592,565, Oct. 3, 1990, abandoned.

[51] Int. Cl.$^6$ .............................. C11D 7/30; C11D 7/50; C23G 5/028; B08B 3/04
[52] U.S. Cl. .............................. 510/412; 134/40; 134/42; 252/364; 570/134; 510/175; 510/177; 510/244; 510/256; 510/273; 510/365; 510/411
[58] Field of Search ......................... 570/134; 252/162, 252/170, 171, 172, 364, DIG. 9; 134/12, 31, 38, 40, 42

[56] References Cited

U.S. PATENT DOCUMENTS

| | | | |
|---|---|---|---|
| 2,490,764 | 12/1949 | Benning et al. | 260/653 |
| 2,975,220 | 3/1961 | Hauptschein | 260/653.1 |
| 3,022,356 | 2/1962 | Ver Nooy, III | 260/633 |
| 3,355,498 | 11/1967 | Pascal et al. | 252/570 |
| 3,729,567 | 4/1973 | Terrell | 424/350 |
| 3,799,995 | 3/1974 | Hutchinson | 570/142 |
| 3,927,129 | 12/1975 | Haszeldine et al. | 260/653.1 R |
| 4,157,979 | 6/1979 | Walters | 252/67 |
| 4,418,185 | 11/1983 | Throckmorton et al. | 526/201 |
| 4,440,971 | 4/1984 | Harrold | 252/570 |
| 4,541,943 | 9/1985 | Powell | 252/67 |
| 4,668,273 | 5/1987 | Haase | 71/67 |
| 4,947,881 | 8/1990 | Magid et al. | 134/40 |
| 5,059,728 | 10/1991 | Li et al. | 570/134 |
| 5,064,559 | 11/1991 | Merchant et al. | 252/171 |
| 5,064,560 | 11/1991 | Merchant | 252/171 |
| 5,073,288 | 12/1991 | Anton | 252/162 |
| 5,073,290 | 12/1991 | Anton et al. | 252/162 |
| 5,073,291 | 12/1991 | Robeck et al. | 252/171 |
| 5,076,956 | 12/1991 | Anton | 252/162 |
| 5,084,199 | 1/1992 | Anton | 252/170 |
| 5,100,572 | 3/1992 | Merchant | 252/171 |
| 5,118,359 | 6/1992 | Li et al. | 134/42 |
| 5,221,361 | 6/1993 | Anton et al. | 134/38 |
| 5,221,493 | 6/1993 | Merchant et al. | 252/67 |
| 5,250,208 | 10/1993 | Merchant et al. | 252/67 |
| 5,250,213 | 10/1993 | Rozen et al. | 252/162 |
| 5,268,122 | 12/1993 | Rao et al. | 252/171 |
| 5,302,212 | 4/1994 | Desbiendras et al. | 134/40 |

FOREIGN PATENT DOCUMENTS

| | | |
|---|---|---|
| 2009169 | 8/1990 | Canada . |
| 432672 | 12/1990 | European Pat. Off. . |
| 0431458A1 | 6/1991 | European Pat. Off. . |
| 86026832 | 6/1986 | Japan . |

OTHER PUBLICATIONS

Chengxue et al *J. Org Chem* vol 47 pp. 2009–2013 (1982) no month available.
Bagnall et al *J. Fluorine Chem* vol 13 pp. 325–335 (1979) no month available.
Knuniants et al *Bull Acad. Sci. USSR, Chem Sci.* p. 884 (1958) no month available.
Haszeldine *J. Chem. Soc.* pp. 3761–3765 (1953) no month available.
LaZerte et al *J. Am. Chem. Soc.* vol 75 pp. 4525–4528 (1953) no month available.
Haszeljine et al *J. Chem Soc. Perkin Trans. I.* pp. 565–569 (1979) no month available.
Hauptschein et al *J. Am. Chem. Soc.* vol 80 pp. 846–851 (1958) no month available.
Hasek et al *J. Am Chem. Soc.* vol 82 pp. 543–551 (1960) no month available.
Chambers *Tetrahedron* vol 20 pp. 497–506 (1964) no month available.
Evans et al *J. Chem Soc. Perkin Trans I.* pp. 649–654 (1973) no month available.
Huang et al *J. Fluorine Chem* vol 36 pp. 49–62 (1987) no month available.
Sudenkov, *J. Org. Chem, USSR* vol 14 pp. 1240–1241 (1978) no month available.
Ward *J. Org. Chem* vol 30 pp. 3009–3011 (1965) no month available.
Snegirev, *Bull Acad. Sci USSR, Chem Div* pp. 2489–2494 (1983) no month available.
Krasnikova et al *Bull Acad Sci USSR, Chem Div.* p. 444 (1973) no month available.

*Primary Examiner*—Linda Skaling Therkorn
*Attorney, Agent, or Firm*—Michael K. Boyer

[57] ABSTRACT

Cleaning compositions comprising an acyclic aliphatic hydrofluorocarbon represented by the formula:

$$C_xH_yF_{2x+2-y}$$

where x equals 4, 5 or 6, y equals 1, 2 or 3 with the proviso that when x equals 4, Y equals 2 or 3, and a co-solvent boiling between 20° C.–105° C. that are alcohols, esters, ethers, ketones, chlorinated hydrocarbons, optionally containing fluorine, having 1–4 carbons atoms, acetonitrile and nitromethane.

9 Claims, No Drawings

HYDROFLUOROCARBON CLEANING COMPOSITIONS

This is a continuation of application Ser. No. 07/787,998 filed Nov. 7, 1991, now abandoned, which is a continuation-in-part of U.S. application Ser. No. 07/723,312 filed Jun. 28, 1991, now U.S. Pat. No. 5,100,572 which, in turn, is a continuation-in-part of U.S. application Ser. No. 07/592,565 filed Oct. 3, 1990, now abandoned; in addition, Ser. No. 787,998 is also a continuation-in-part of U.S. patent application Ser. No. 07/595,833 filed Oct. 11, 1990, now U.S. Pat. No. 5,064,559 and also U.S. application Ser. No. 07/595,834 filed Oct. 11, 1990, now U.S. Pat. No. 5,064,560.

BACKGROUND OF THE INVENTION

The present invention is directed to cleaning agent compositions, especially useful in the electronics industry, containing acyclic aliphatic hydrofluorocarbons and a co-solvent.

Various organic solvents have been used as cleaning liquids for the removal of contaminants from articles and materials. Certain chlorofluorocarbons such as 1,1,2-trichloro-1,2,2-trifluoroethane have been reported as useful for this purpose, particularly with regard to cleaning organic polymers and plastics which may be sensitive to other more common and more powerful solvents such as trichloroethylene or perchloroethylene.

Solvent cleaning and degreasing with chlorofluorocarbon-based solvents have been used extensively in industry for cleaning solid surfaces, particularly the surfaces of intricate parts. Common uses include the removal of fluxes from circuit boards and removing oils, grease and abrasives from machine parts. Cleaning procedures include exposing the cool article to vapors of the boiling chlorofluorocarbon cleaning composition and allowing any chlorofluorocarbon to evaporate from the cleaned article. Another cleaning technique involves immersing the article to be cleaned in a sump of boiling chlorofluorocarbon cleaning composition which removes most of the soil from the article, followed by a second immersion of the article in fresh chlorofluorocarbon at about room temperature and finally exposing the cooled article to vapors over the boiling sump. However, hydrofluorocarbons used alone are not effective cleaning agents.

Recently, the long term environmental effects of chlorofluorocarbons have come under scientific scrutiny because it has been postulated that these materials because of their high stability are able to reach the stratosphere where under the influence of ultraviolet radiation release chlorine atoms which, in turn, undergo chemical reaction with stratospheric ozone. Reduction of the stratospheric ozone layer would increase the amount of ultraviolet radiation reaching the earth's surfaces. In view of the potential environmental problems associated with stratospheric ozone depletion, there is a need for new materials possessing properties which make them useful substitutes for applications in which chlorofluorocarbons have been used.

Accordingly, there is a need in the industry for effective cleaning agents for removing oils, grease and abrasives, fluxes, water, etc., which are nonflammable, possess low toxicity and are degradable in the lower atmosphere.

SUMMARY OF THE INVENTION

The present invention is directed to a cleaning composition comprising a major amount of at least one acyclic aliphatic hydrofluorocarbon represented by the formula:

$$C_xH_yF_{2x+2-y}$$

where x equals 4, 5 or 6, y equals 1, 2 or 3 with the proviso that when x equals 4, y equals 2 or 3, and about 1–45 weight percent, preferably 3–15 weight percent, of at least one co-solvent, or mixtures thereof, boiling between 20° C.–105° C. at atmospheric pressure selected from the group consisting of alcohols having 1–4 carbons atoms, esters having 3–6 carbon atoms, ethers having 2–6 carbon atoms, ketones having 3–6 carbon atoms, chlorinated hydrocarbons, optionally containing fluorine, having 1–4 carbon atoms, acetonitrile and nitromethane. Preferably, the cleaning compositions are acyclic aliphatic hydrofluorocarbons represented by the formulae $C_4H_2F_8$, $C_4H_3F_7$, $C_5HF_{11}$, $C_5H_2F_{10}$, $C_5H_3F_9$, $C_6HF_{13}$, $C_6H_2F_{12}$ and $C_6H_3F_{11}$, and, preferably the co-solvents are alcohols having 1–4 carbon atoms or chlorinated hydrocarbons, optionally containing fluorine, having 1–4 carbon atoms or mixtures thereof.

The surface of the substrates are cleaned by treating the surface by, for example, immersion, spraying or wiping the surface, with the cleaning composition. The compositions of this invention are effective cleaning agents. They are well-suited for removal of solder flux residue from printed circuit boards; oils and greases from metal, ceramic, glass, or plastic parts; and water from wetted articles such as metal parts or printed circuit boards. In addition, the compositions of this invention have low toxicity. Since the compositions of the present invention do not contain chlorofluorocarbons, they have a significantly reduced potential to deplete the stratospheric ozone layer. In addition, since the fluorocarbon portion of these cleaning compositions contain hydrogen (that is, are hydrofluorocarbons, HFCs), they have reduced atmospheric lifetimes relative to perfluorinated compounds and thus have a reduced global warming potential relative to perfluorinated compounds.

DETAILED DESCRIPTION OF THE INVENTION

The cleaning compositions of the present invention contain at least one acyclic aliphatic hydrofluorocarbon represented by the formula:

$$C_xH_yF_{2x+2-y}$$

where x equals 4, 5 or 6 and y equals 1, 2 or 3 with the proviso that when x equals 4, y equals 2 or 3, together with certain co-solvents.

Preferably, the acyclic aliphatic hydrofluorocarbons have the empirical formulae $C_4H_2F_8$, $C_4H_3F_7$, $C_5HF_{11}$, $C_5H_2F_{10}$, $C_5H_3F_9$, $C_6HF_{13}$, $C_6H_2F_{12}$ and $C_6H_3F_{11}$. In addition, the preferred acyclic aliphatic hydrofluorocarbons have a nominal boiling point in the range of about 30° to 90° C. and possess sufficient stability for commercial cleaning processes.

Most preferably, the acyclic aliphatic hydrofluorocarbons have the empirical formula $C_4H_2F_8$, $C_5HF_{11}$, $C_5H_2F_{10}$ and $C_5H_3F_9$, and have a normal boiling point in the range from 40° to 70° C. In addition most preferred acyclic aliphatic hydrofluorocarbons have low flammability in air and may be synthesized by means that are economically suitable for commercial-scale manufacture.

The preferred boiling range of the cleaning compositions of the present invention is based on the current industry standard which uses non-flammable CFC-113 (B.P. 47° C.) as the fluorocarbon component of cleaning compositions. Stability under the conditions of the cleaning process is crucial to long lifetime of the solvents if they recycled in the cleaning process, and to minimize the formation of possibly toxic or low-boiling by-products. Non-flammability is essential for many of the applications for which such cleaning compositions may be applied.

The cleaning compositions of the present application are prepared by merely mixing the hydrofluorocarbon and co-solvent, preferably in the liquid state. The ingredients are added to a suitable container in any order and thoroughly mixed by appropriate means of agitation.

These acyclic aliphatic hydrocarbons containing 4–6 carbon atoms used in the cleaning compositions of this invention can be prepared by reactions which are known to those skilled in the art of organofluorine chemistry. Illustrative methods for the preparation of acyclic aliphatic hydrofluorocarbons containing 4, 5 and 6 carbon atoms are described hereinbelow.

$CHF_2CF_2CF_2CHF_2$ (HFC-338pcc) has been prepared by oxidation of $CH(OH)(C_2HF_4)(C_4F_8H)$, as disclosed by Ver Nooy in U.S. Pat. No. 3,022,356, by decomposition of $CH_3SO_2(CF_2)_4SO_2CH_3$ in the presence of NaOH, as disclosed by Pascal and Ward in U.S. Pat. No. 3,355,498, or by thermolysis of $(CHF_2CF_2COO)_2$ as disclosed by Chengxue et al. in *J. Org. Chem.*, Vol. 47, pp. 2009–2013 (1982). $CHF_2CF_2CHFCF_3$ (HFC-338mec) has been prepared by reaction of $CH_2F_2$ with $CF_2=CFCF_3$, as disclosed by Haszeldine in U.S. Pat. No. 3,927,129. $CH_2FCF_2CHFCF_3$ (HFC-347mec) has been prepared by the reaction of methyl fluoride with hexafluoropropylene as disclosed by Haszeldine and Rowland in U.S. Pat. No. 3,927,129 or by the reaction of potassium fluoride with the tosylate ester of 2,2,3,4,4,4-hexafluoro-1-butanol as reported by Bagnall et al. in *J. Fluorine Chem.*, Vol. 13, pp. 325–335 (1979). $CH_2FCH(CF_3)_2$ (HFC-347mmz) has been prepared by hydrogenation of 1,3,3,3-tetrafluoro-2-trifluoromethylpropene over a palladium catalyst as reported by Knunyants et al. in *Izv. Adad. Nauk S.S.S.R., Odtel. Khim. Nauk*, pp. 906–907 (1958).

$CHF_2(CF_2)_3CF_3$ (HFC-42-11p) has been prepared by reduction of $CF_2I(CF_2)_3CF_3$ using hydrogen over a Raney nickel catalyst or by the action of ethanolic potassium hydroxide as disclosed by Haszeldine in *J. Chem. Soc.*, 1953, pp. 3761–3765, by the reaction of antimony pentafluoride with $CClF_2(CF_2)_3CHF_2$ as disclosed by Benning et al. in U.S. Pat. No. 2,490,764, or by decarboxylation of $NaO_2C(CF_2)_4CF_3$ in ethylene glycol, as disclosed by LaZerte et al. in *J. Am. Chem. Soc.*, Vol. 75, pp. 4525–4528 (1953). $CF(CF_3)_2CF_2CHF_2$ (HFC-42-11mmyc) has been prepared by condensation of heptafluoroisopropyl iodide with tetrafluoroethylene to give $CF(CF_3)_2CF_2CF_2I$ followed by reduction with zinc in the presence of sulfuric acid as disclosed by Chambers et al. in *Tetrahedron*, Vol. 20, pp. 497–506 (1964). $CH(CF_3)_2CF_2CF_3$ (HFC-42-11mmz) has been prepared by the reaction of cesium fluoride with perfluoro-3-methyl-1-butene in sulfolane in the presence of water as disclosed by Haszeldine et al. in *J. Chem. Soc., Perkin Trans. I*, pp. 565–569 (1979). $CF_3CHFCHFCF_2CF_3$ (HFC-43-10mee) has been prepared by reaction of HFP with TFE followed by hydrogenation of the intermediate perfluoro-2-pentene as disclosed by Krespan et al. in copending application. $CHF_2CH_2CF_2CF_2CF_3$ (HFC-449pf) can be prepared by a hydride reduction of $CF_3CF_2CF_2CH_2CF_2I$ which is derived from the reaction of vinylidene fluoride with iodoheptafluoropropane as described by Hauptschein et al. in *J. Am. Chem. Soc.*, Vol. 80, pp. 846–851 (1958). $CHF_2(CF_2)_3CHF_2$ (HFC-43-10pccc) has been prepared by reaction of $SF_4$ with $CHF_2(CF_2)_3CHO$ as described by Hasek et al. in *J. Am. Chem. Soc.*, Vol. 82, pp. 543–555 (1960). $CF(CF_3)_2CH_2CF_3$ (HFC-43-10mmyf) has been prepared by condensation of heptafluoroisopropyl iodide with 1,1-difluoroethylene to give $CF(CF_3)_2CH_2CF_2I$ followed by fluorination with $SbCl_2F_3$ as disclosed by Chambers et al. in *Tetrahedron*, Vol. 20, pp. 497–506 (1964). $CH(CF_3)_2CHFCF_3$ (HFC-43-10mmze) has been prepared by hydrogenation of 1,1,1,4,4,4-hexafluoro-2-(trifluoromethyl)-2-butene over a palladium catalyst as disclosed by Evans et al. in *J. Chem. Soc. Perkin Trans. I*, pp 649–654 (1973. $CH_2F(CF_2)_3CHF_2$ (HFC-449pccc) has been prepared by tosylation of $CH_2OH(CF_2)_3CHF_2$ followed by reaction with KF as disclosed in Terrell in U.S. Pat. No. 3,729,567. $CF_3CH_2CF_2CHFCF_3$ (HFC-449mecf) has been prepared by the reaction of hexafluoropropylene with 1,1,1-trifluoroethane at 310° C. as disclosed by Haszeldine and Rowland in U.S. Pat. No. 3,927,129. $CH(CF_3)_2CH_2CF_3$ (HFC-449mmzf) has been prepared by hydrogenation of 1,1,1,4,4,4-hexafluoro-2-(trifluoromethyl)-3-iodo- 2-butene over a palladium catalyst as disclosed by Evans et al. in *J. Chem. Soc. Perkin Trans. I*, pp. 649–654 (1973).

$CHF_2(CF_2)_4CF_3$ (HFC-52-13p) has been prepared by reduction of $CF_2I(CF_2)_4CF_3$ using ethanolic KOH as disclosed by Haszeldine et al. in *J. Chem. Soc.*, pp. 3761–3768, or by decarboxylation of $CF_3(CF_2)_5CO_2Na$ as disclosed by Huang et al. in *J. Fluorine Chem.*, Vol. 36, pp. 49–62 (1987). $CH(CF_3)_2CF_2CF_2CF_3$ (HFC-52-13mmz) has been prepared by the reaction of perfluoro-2-methyl-2-pentene with water in the presence of an amine catalyst as described by Sudenkov in *J. Org. Chem. USSR*, Vol. 14, pp. 1240–1241 (1978). $CHF_2(CF_2)_4CHF_2$ (HFC-53-12pcccc) has been prepared by boiling 1,6-bis(methyl sulfonyl)dodecafluorohexane in the presence of aqueous sodium hydroxide as disclosed by Ward in *J. Org. Chem.*, Vol. 30, pp. 3009–3011 (1965). $CF(CF_3)_2CHFCHFCF_3$ (HFC-53-12mmyee) has been prepared by the palladium-catalyzed hydrogenation of 4-trifluoromethyl-perfluoro-2-pentene as described by Snegirev et al. in *Bull, Acad, Sci. USSR, Chem, Div.*, pp. 2489–2494 (1983). $CH(CF_3)_2CHFCF_2CF_3$ (HFC-53-12mmze) has been prepared by the palladium-catalyzed hydrogenation of 2-trifluoromethyl-perfluoro-2-pentene as described by Snegirev et al. in *Bull. ACad. Sci. USSR. Chem. Div.*, pp. 2489–2492 (1983). $CH(CF_3)_2CH(CF_3)_2$ (HFC-53-12mmzz) has been prepared by the electrochemical decarboxylative dimerization of 3,3,3-trifluoro-2-trifluoromethylpropionic acid as described by Krasnikova et al. in *Bull. Acad. Sci. USSR. Chem. Div.*, p. 444 (1973). $CH(CF_3)_2CH_2CF_2CF_3$ (HFC-54-11mmzf) has been prepared by reduction of 2-trifluoromethyl-perfluoro- 2-pentene with sodium borohydride as described by Snegirev et al. in *Bull. Acad. Sci. USSR. Chem. Div.*, pp. 2489–2492 (1983).

Representative acyclic aliphatic hydrofluorocarbons that can be used as a component of the cleaning composition include 1,1,2,2,3,3,4,4-octafluorobutane, 1,1,1,2,2,3,5,5,5-nonafluoropentane, 1,1,1,2,2,3,4,5,5,5-decafluoropentane, 1,1,1,2,2,4,5,5,5-nonafluoropentane, 1,1,1,2,2,3,3,5,5,5-decafluoropentane, 1,1,1,4,4,5,5,5-octafluoro-2-trifluoromethylpentane, 1,1,1,3,4,4,5,5,5-nonafluoro-2-trifluoromethylpentane, 1,1,1,2,2,3,3,4,5,6,6,6-dodecafluorohexane, 1,1,1,2,2,4,4,5,5,5-decafluoropentane, 1,1,1,2,3,3,4,4-octafluorobutane, 1,1,1,2,2,3,3,4,4,5,5-undecafluoropentane, 1,1,1,2,3,3,4,4-octafluoro-2-trifluoromethylbutane, 1,1,1,3,3,4,4,4-octafluoro-2-trifluoromethylbutane, 1,1,2,2,3,3,4,4,5,5-decafluoropentane, 1,1,1,2,4,4,4-heptafluoro-2-trifluoromethylbutane, 1,1,1,3,4,4,4-heptafluoro-2-trifluoromethylbutane, 1,1,2,2,3,3,4,4,5-nonafluoropentane, 1,1,1,2,3,3,5,5,5-nonafluoropentane, 1,1,1,3,4,4-hexafluoro-2-trifluoromethylbutane, 1,1,1,2,2,3, 3,4,4,5,5,6,6-tridecafluorohexane, 1,1,1,3,3,4,4,5,5,5-decafluoro-2-trifluoromethylpentane, 1,1,2,2,3,3,4,4,5,5,6,6-dodecafluorohexane, 1,1,1,2,3,4,5,5,5-nonafluoro-2-trifluoromethylpentane and 1,1,1,4,4,4-hexafluoro-2,3-bis(trifluoromethyl)butane.

The co-solvents used in the compositions of this invention have a boiling point at atmospheric pressure of from 20° C.–105° C. The co-solvents can be alcohols having 1–4 carbon atoms, for example methyl alcohol, ethyl alcohol, n-propyl alcohol, isopropyl alcohol, sec.-butyl alcohol and tert.-butyl alcohol. Compositions containing these lower aliphatic alcohols are especially useful for removing flux residues from circuit boards. Esters that can be used in the composition that contain 3–6 carbon atoms include methyl acetate, methyl butyrate, ethyl acetate, ethyl propionate, propyl acetate, butyl formate, tert.butyl acetate. Ethers containing 2–6 carbon atoms are suitable co-solvents and include diethyl ether, methyl ethyl ether, methyl propyl ether, dipropyl ether, ethyl butyl ether. Ketones having 3–6 carbon atoms can be used. Representative ketones include acetone, methyl ethyl ketone, diethyl ketone, methyl-n-propyl ketone. Chlorinated hydrocarbons, optionally containing fluorine, having 1–4 carbon atoms are generally useful for removing grease and oil from machine parts. Representative halogenated hydrocarbons include 1,2-dichloroethylene, 1,1-dichloroethane, 1,2-dichloroethane, dichloromethane, chloroform, butyl chloride, 1,1-dichlorotrifluoroethane, 1,1-dichloro-1-fluoroethane and 1,1-dichloro-2,2,3,3,3-pentafluoropropane, 1,3-dichloro-1,2,2,3,3-pentafluoropropane, and 2,2-dichloro-1,1,3,3,3-pentafluoropropane. Generally when alcohols are used with the acyclic aliphatic hydrofluorocarbon, the alcohols are added in amounts from about 2–15 weight percent. When the co-solvent is an ester or an ether, generally the amount of co-solvent added to the cleaning composition is from about 2–15 weight percent and 5–20 weight percent, respectively. Ketones are usually added as co-solvent to the aliphatic hydrofluorocarbon in amounts of from about 5–20 weight percent and usually chlorinated hydrocarbons are added to the aliphatic hydrofluorocarbon in amounts of from about 10–45 weight percent.

Many of the cleaning compositions of this invention form minimum boiling azeotropes. This behavior is advantageous in many cleaning procedures because preferential evaporation or boiling of one component from the cleaning compositions is avoided. For mixtures where azeotrope formation occurs, it is convenient to employ compositions which match or approach the composition of the azeotrope so that no changes in solvent proportions will occur during use.

The cleaning compositions of this invention may additionally contain other ingredients to improve their performance in certain applications. Such ingredients include surfactants, antioxidants, stabilizers and metal deactivators. In some instances it may be advantageous to add minor amounts of solvents boiling well above 105° C. For example, in the initial cleaning stage for circuit boards, the rate of cleaning may be increased by including up to 20% by weight of surfactants in the compositions of this invention. The high boiling solvent is not employed in the rinse stage. Other high boiling compounds including esters and halogenated, e.g., chlorinated, hydrocarbons, for instance, may be useful in accelerating initial cleaning in a similar manner.

The invention is further illustrated by the following specific Examples wherein parts are by weight unless otherwise indicated.

EXAMPLE 1

A cleaning composition was prepared by mixing 91.9 parts by weight of mixed hydrofluoropentanes [80% by weight 1,1,1,2,2,3,5,5,5-nonafluoropentane ($C_5H_3F_9$), 15% by weight 1,1,1,2,2,3,4,5,5,5-decafluoropentane ($C_5H_2F_{10}$) and 5% by weight 1,1,1,2,2,4,5,5,5-nonafluoropentane ($C_5H_3F_9$)] and 8.1 parts by weight anhydrous methanol. The cleaning composition is a minimum boiling azeotrope having a boiling point 43.4°±0.4° C. [The mixed hydrofluoropentanes were obtained by hydrogenation of perfluoropentene-2 diluted with an equal weight of absolute ethanol over a 5% palladium or charcoal catalyst at 25° C. under 50 psig of hydrogen.]

Several single sided circuit boards were coated with activated rosin flux and soldered by passing the boards over a preheater to obtain top side board temperatures of approximately 200° F. (93° C.), and then through 500° F. (260° C.) molten solder. The soldered boards were defluxed separately, with the azeotropic mixture described above, by suspending a circuit board, first, for 3 minutes in a boiling sump, which contained the azeotropic mixture, then, for 1 minute in a rinse sump, which contained the same azeotropic mixture, and, finally, for 1 minute in the solvent vapor above the boiling sump. After cleaning with the azeotropic mixture, the boards had no visible residue remaining thereon. The cleaning composition had no adverse effect on the circuit board.

EXAMPLE 2

Three cleaning compositions were prepared by mixing 1,1,1,2,3,4,4,5,5,5-decafluoropentane (43-10mee) with methanol, ethanol and iospropanol in the proportions tabulated below. These compositions are azeotropes that have the boiling points indicated in the following Table.

| 43–10mee, parts | Co-solvent | Co-solvent, parts | B.P.,°C. |
| --- | --- | --- | --- |
| 95.3 | Methanol | 4.7 | 39.9 ± 0.6 |
| 97.1 | Ethanol | 2.9 | 43.4 ± 0.7 |
| 97.4 | Isopropanol | 2.6 | 45.5 ± 1.8 |

Each of the cleaning compositions were used to clean soldered circuit boards following the procedure described in Example 1. Boards cleaned in each of the three cleaning compositions had no visible residue remaining thereon.

EXAMPLE 3

A single-sized circuit board was coated with activated rosin flux and soldered by passing the board over a preheater to obtain a top side board temperature of approximately 200° F. and then through 500° F. molten solder. The soldered board was cleaned in an azeotropic cleaning composition of 94.9% by weight 1,1,1,2,2,3,3,5,5,5-decafluoropentane and 5.1% by weight methanol (B.P. 40.4° C.) by suspending it, first, for 3 minutes in a boiling sump, then 1 minute in a rinse sump and, thereafter, for 1 minute in the solvent vapor above the boiling sump. The board thus cleaned had no visible residue remaining on it.

EXAMPLE 4

The circuit board cleaning procedure of Example 3 was repeated using an azeotropic cleaning composition of 91% by weight of 1,1,1,4,4,5,5,5-octafluoro-2-trifluoromethylpentane (HFC-54-11mmzf) and 9% by weight methanol (B.P. 47.8° C.). No visible residue remained on the board after cleaning.

EXAMPLE 5

The circuit board cleaning procedure of Example 3 was repeated using Composition (A) which is an azeotrope 90.8% by weight 1,1,1,3,4,4,5,5,5-nonafluoro-2-trifluoromethylpentane (HFC-53-12mmze ) and 9.2% weight methanol (B.P. 53° C.) and Composition (B) which is an azeotrope of 92.5% by weight HFC-53-12mmze and 7.5% by weight ethanol (B.P. 59° C). The boards cleaned with either Composition (A) or Composition (B) had no visible residue.

EXAMPLE 6

The circuit board cleaning procedure of Example 3 was repeated with a cleaning composition which is an azeotrope of 46.3% by weight HFC-53-12mmze, 46.3% by weight HFC-54-11mmzf and 7.4% by weight ethanol (B.P.~52° C). The boards cleaned with this composition had no visible residue.

EXAMPLE 7

The circuit board cleaning procedure of Example 3 was repeated with a cleaning composition which is a ternary azeotrope of 64% by weight 1,1,1,2,3,4,4,5,5,5-decafluoropentane, 35% by weight trans-1,2-dichloroethylene and 1.0% by weight ethanol (B.P. 35° C). Following cleaning, the circuit boards had no visible residue.

EXAMPLE 8

Oil removal tests were run by (a) immersing a clean assembly of 3 nuts and 3 washers on a ¼"×2" bolt in a cutting oil 25° C. for 15 seconds, (b) removing the assembly from the oil and allowing it to drain for 15 seconds, (c) immersing the oily assembly for 60 seconds in a refluxing cleaning composition of this invention, (d) removing the degreased assembly from the cleaning composition without rinsing, (e) placing the assembly on paper towels and allowing it to dry at 25° C. for at least 3 hours exposed to the draft of a fume hood and, finally (f) visually inspecting said assembly, including checking the threads under the nuts, for traces of residual oil.

In this Example, five different cutting oils were tested with each of nine cleaning compositions of this invention. The cutting oils used are listed below.

- Oil #1 - Sanicut 416 cutting oil, available from Sun Oil Co., Philadelphia, Pa.,
- Oil #2 - Rust-Lick Cutzol 711, a chlorinated cutting oil, available from Rust-Lick Co., Danvets, Mass.,
- Oil #3 - Texaco soluble oil D, a water-soluble cutting oil, available from Texaco Oil Co., Houston, Tex.,
- Oil #4 - Cutting oil 7B-1, a drawing oil, available from Oak International Chemical Co., Sturgis, Mich.,
- Oil #5 - Texaco Sultex D, a sulfurized cutting oil, available from Texaco Oil Co., Houston, Tex.

The chemical composition and boiling point of each of the cleaning compositions used in this Example are listed below, along with observations regarding the effectiveness of oil removal. The aliphatic hydrofluorocarbon used in each of the nine cleaning compositions was 1,1,1,2,2,3,4,5,5,5-decafluoropentane, hereinafter 43-10mee.

8-1 62.1% 43-10mee
  37.9% trans-1,2-dichloroethylene
  Boiling point 37.8° C.
  Remarks: No visible oil for Oils #2–5. Oil #1 was visible.
8-2 73.0% 43-10mee
  27.0% 1,1-dichloroethane
  Boiling point 45.4° C.
  Remarks: No visible oil for Oils #2–5. Oil #1 was visible.
8-3 60.2% 43-10mee
  3.7% methanol
  36.1% trans-1,2-dichloroethylene
  Boiling point 35.5° C.
  Remarks: No visible oil for Oils #1–5.
8.4 44.5% 43-10mee
  2.8% methanol
  52.7% 1,1-dichloroethane
  Boiling point 42.9° C.
  Remarks: No visible oil for Oils #1–5.
8.5 66.1% 43-10mee
  1.9% ethanol
  31.9% trans-1,2-dichloroethylene
  Boiling point 38.0° C.
  Remarks: No visible oil for Oils #1–5.
8.6 44.5% 43-10mee
  0.8% ethanol
  54.6% 1,1-dichloroethane
  Boiling point 47.2° C.
  Remarks: No visible oil for Oils #1–5.
8.7 93.6% 43-10mee
  6.4 % methanol
  Boiling point 44.5° C.
  Remarks: Visible oil remained for Oils #1–5.
8.8 97.0% 43-10mee
  3.0% ethanol
  Boiling point 48.8° C.
  Remarks: Visible oil remained for Oils #1–5.
8.9 83.9% 43-10mee
  17.1% acetone
  Boiling point 57.6° C.
  Remarks: Visible oil remained for Oils #1–5.

The tests indicate that cleaning compositions containing chlorinated hydrocarbons as co-solvents are more effective for oil removal than are cleaning compositions containing oxygenated co-solvents such as alcohols and acetone.

EXAMPLE 9

This Example illustrates the use of the cleaning compositions of this invention for dewatering.

A small perforated stainless steel basket containing 10 g of glass beads having a diameter of 0.5 mm was weighed dry and then immersed in distilled water. The basket was removed from the water and its exterior was carefully blotted dry to remove exterior water and then reweighed to determine the amount of water trapped between the beads. The basket containing the wet beads was promptly immersed at 25° C. in a cleaning composition of 1,1,2,2,3,3,4,4-octafluorobutane and trans-1,2-dichloroethylene 66.2% and 33.8% respectively) additionally containing 500 ppm of a cationic surfactant of quaternary ammonium alkyl phosphate. After 1 minute the basket was removed from the cleaning composition, the exterior of the basket blotted and the basket was reweighed. About 80% of the water initially trapped between the beads was removed.

When the procedure was repeated with a cleaning composition containing 1,1,1,2,2,3,4,5,5,5-decafluoropentane and trans-1,2-dichloroethylene (63.2% and 36.8% respectively) additionally containing 500 ppm of the cationic surfactant that is a quaternary ammonium alkyl phosphate, about 93% of the trapped water was removed.

I claim:

1. A composition comprising a major amount of at least one hydrofluorocarbon represented by the formula:

$CH(CF_3)_2CHFCF_3$ and about 1–45 weight percent of at least one co-solvent boiling between 20° C.–105° C. at atmospheric pressure selected from the group consisting of methanol, and ethanol.

2. A composition comprising a major amount of at least one straight chain hydrofluorocarbon represented by the formula:

$C_xH_yF_{2x+2-y}$ where x is 5, y is 2 or 3 and about 1–45 weight percent of at least one co-solvent selected from the group consisting essentially of methanol, and ethanol.

3. A cleaning composition of claim 2 wherein the hydrofluorocarbon is $C_5H_2F_{10}$.

4. A cleaning composition of claim 2 wherein the acyclic aliphatic hydrofluorocarbon is $C_5H_3F_9$.

5. A composition of claim 1 or 2 containing 3–15 weight percent co-solvent.

6. A method for cleaning the surface of an article wherein the surface of the article is contacted with a cleaning composition of claim 1 or 2.

7. The composition of claim 1 or 2 wherein said co-solvent comprises methanol.

8. The composition of claim 1 or 2 wherein said co-solvent comprises ethanol.

9. The composition of claim 2 wherein said hydrofluorocarbon comprises $CF_3CHFCHFC_2CF_3$.

* * * * *